United States Patent [19]

Kline et al.

[11] 4,232,924

[45] Nov. 11, 1980

[54] CIRCUIT CARD ADAPTER

[75] Inventors: Mark H. Kline; John T. Liebel, Jr.; Ronald D. Sheridan, all of Williamsville, N.Y.

[73] Assignee: Nanodata Corporation, Buffalo, N.Y.

[21] Appl. No.: 953,645

[22] Filed: Oct. 23, 1978

[51] Int. Cl.[3] .................... H05K 1/07

[52] U.S. Cl. .................... 339/17 L; 339/176 MP

[58] Field of Search .............. 339/17 L, 150 B, 154 A, 339/155 R, 156 R, 176 MP, 193 P, 17 LM, 17 M

[56] References Cited

U.S. PATENT DOCUMENTS

| | | | |
|---|---|---|---|
| 3,663,925 | 5/1972 | Proctor | 330/176 MP |
| 3,930,707 | 1/1976 | Venaleck et al. | 339/176 MP |
| 4,080,028 | 3/1978 | Gilbert | 339/154 A |

FOREIGN PATENT DOCUMENTS

| | | | |
|---|---|---|---|
| 1313641 | 4/1973 | United Kingdom | 339/176 MP |

*Primary Examiner*—Neil Abrams

*Attorney, Agent, or Firm*—Christel, Bean & Linihan

[57] ABSTRACT

An adapter for transferring the electrical connections of a circuit card of an electrical system from a fixed connector in a congested chassis area on one side of a master interconnect board to a convenient access area on the opposite side of the master board. The adapter comprises a first electrical connector element for making electrical connection to the system at a location on the opposite side of the master board in correspondence with the fixed connector, a second electrical connector element for making electrical connection to the circuit card, and an element for joining the first and second electrical connector elements mechanically and electrically adjacent the opposite side of the master board. A circuit card can be disconnected from the fixed connector and moved to the opposite side of the master board and connected to the second electrical connector of the adapter to facilitate working on the circuit card in a manner which does not increase significantly the electrical path length from the master board to the circuit card.

21 Claims, 4 Drawing Figures

CIRCUIT CARD ADAPTER

BACKGROUND OF THE INVENTION

This invention relates to the art of electrical connecting apparatus, and more particularly to a new and improved apparatus for transferring the electrical connections of a circuit card of an electrical system from a fixed connector in a congested area of a master interconnect board to a convenient access area of the board.

Many electrical and electronic systems include printed circuit boards or cards connected in closely spaced, stacked relation to a system reference board or master interconnect board. A problem occurs in attempting to work on components of a particular printed circuit board, for example making tests, since the board is located so close to a neighboring board in the stacked arrangement that access is extremely difficult and usually impossible.

A solution of the prior art is known as an extender card which is a card or board of substantially the same size as the printed circuit board or card having electrical connectors on opposite edges of the card and interconnected by electrical leads. The printed circuit board to be tested is disconnected from the stack, the extender card is connected in its place, and the board to be tested is connected to the extender card. While this provides easy access to the printed circuit board, the leads of the extender card significantly increase the electrical signal path lengths which can be undesirable in certain situations.

SUMMARY OF THE INVENTION

It is, therefore, a primary object of this invention to provide a new and improved apparatus for transferring the electrical connections of a circuit card of an electrical system from a fixed connector in a congested area of a master interconnect board to a convenient access area of the board.

It is a further object of this invention to provide such apparatus which does not increase significantly the electrical path length from the master board to the circuit card.

It is a further object of this invention to provide such apparatus which is simple in construction, effective in operation and convenient in use.

The present invention provides an adapter for transferring the electrical connections of a circuit card of an electrical system from a chassis connector or fixed connector in a congested area on one side of a master interconnect board to convenient access area on the opposite side of the board. The adapter comprises a first means for making electrical connection to the system at a location on the opposite side of the master board correspondence with the fixed connector, second means for making electrical connection to the circuit card, and means defining an electrical path between the first and second means which path has a length no greater than about three times the length of the electrical path through the chassis connector between the master board and the circuit card when connected to the fixed connector. As a result, the circuit card can be disconnected from the fixed connector on the one side of the master board and moved to the opposite side of the master board and connected to the second means of the adapter to facilitate working on the circuit card, for example testing components thereof, in a manner which does not increase significantly the electrical path length from the master board to the circuit card.

The foregoing and additional advantages and characterizing features of the present invention will become clearly apparent upon a reading of the ensuing detailed description together with the included drawing wherein:

BRIEF DESCRIPTION OF THE DRAWING FIGURES

FIG. 1 is a fragmentary side elevational view of an electrical system including a plurality of fixed connectors holding circuit cards in congested relation on one side of a master interconnect board and illustrating an adapter according to the present invention for transferring the electrical connections of a circuit card of the system from a fixed connector in the congested area on one side of the master board to a convenient access area on the opposite side of the board;

DETAILED DESCRIPTION OF THE ILLUSTRATED EMBODIMENT

In many electrical and electronic systems including printed circuit boards or cards connected in closely spaced, stacked relation to a system reference board or master interconnect board, access to components of each card for making tests and performing other operations is extremely difficult and usually impossible since each card is located extremely close to a neighboring card. Extender cards can be employed to provide easy access to the printed circuit card, but the electrical leads of the extender card significantly increase the electrical signal path lengths. In accordance with the present invention, an adapter transfers the electrical connections of a circuit card of an electrical system from a chassis connector or fixed connector in a congested chassis area on one side of the master interconnect board to a convenient access area on the opposite side of the board. The adapter comprises first means for making electrical connection to the system at a location on the opposite side of the master board in correspondence with the fixed connector, second means for making electrical connection to the circuit card, and means defining an electrical path between the first and second means, the path having a length no greater than about triple the length of the electrical path through the fixed connector between the master board and the circuit card connected to the chassis connector. As a result, the circuit card can be disconnected from the fixed connector and moved to the opposite side of the master board and connected to the second means of the adapter to facilitate working on the circuit card in a manner which does not increase significantly the electrical path length from the master board to the circuit card. The adapter preferably comprises a first electrical connector element for making electrical connection to the system at a location on the opposite side of the master board in correspondence with the fixed connector, a second electrical connector element for making electrical connection to the circuit card, and means for joining the first and second electrical connector elements mechanically and electrically adjacent the opposite side of the master board. The joining means comprises a rigid element having mechanical connection to the two electrical connector elements and having electrically conductive paths thereon for conveying signals between the two electrical connectors in a predetermined manner.

Figure 1:
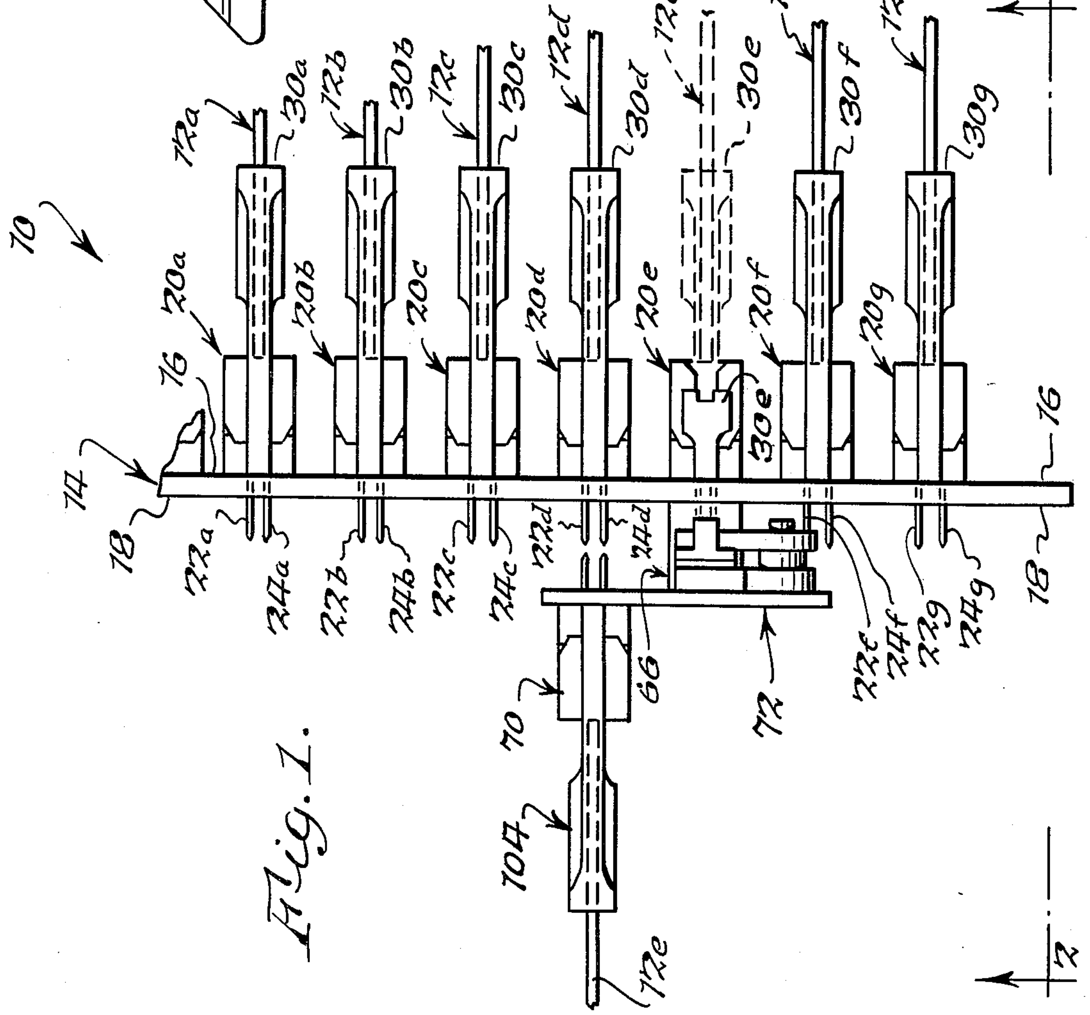

Referring now to FIG. 1, an electrical assembly generally designated 10 includes a plurality of circuit boards or cards 12, in the present example seven circuit cards **12*a*–12*g*, arranged in a closely-stacked arrangement. For convenience in illustration the circuit cards 12 are shown fragmentarily, the cards being rectangular in shape and of various sizes with a somewhat standardized thickness in the range of from about 0.054 inch to about 0.070 inch. The cards 12 are disposed in substantially parallel, closely-spaced planes. Each of the cards or boards 12 contains electrical components and conductors etched or printed thereon in a selected circuit configuration and in a known manner. The circuit cards 12 are mechanically carried by a chassis including a reference board designated 14, also known as a master interconnector board, which serves as a frame. The reference board 14 which is generally rectangular in shape, includes oppositely directed planar surfaces 16 and 18. One side of the reference board, in the assembly shown the side adjacent the surface 16, includes the plurality of circuit cards 12 and corresponding electrical connectors in closely-spaced relation thereby providing a rather congested area. The circuit cards 12 when connected electrically through connectors to the reference board 14 comprise an operative part of the electrical system. In the assembly shown, the region adjacent the opposite surface 18 of reference board 14 is relatively uncongested and provides an area of convenient access. In a typical installation, the reference board 14 is disposed generally vertically, the circuit boards 12 are disposed generally horizontally and extend outwardly from surface 16 of reference board 14 in a manner facing toward the front portion of the chassis. The surface 18 of board 14** typically is in the rear region of the chassis.

The circuit cards 12 are connected to the reference board 14 by a corresponding plurality of chassis or fixed connectors 20. In the assembly shown there are seven connectors **20*a*–20*g*, one connector being provided for each of the circuit boards 12*a*–12*g*, respectively. Each electrical connector element 20 is stationary during operation of the apparatus and serves to hold the corresponding circuit card thereby providing mechanical support for the same and simultaneously providing electrical connections between the card and other connectors or system connection points whereby each of the circuit cards 12 is electrically connected to the remainder of the system. In particular, each electrical connector element 20 has an elongated body of rectangular shape which receives an edge of the corresponding circuit card 12 in a clamping-like or gripping manner. Electrical contacts in the connector body engage corresponding electrical contact portions or regions provided at spaced locations along the edge of the circuit card. The electrical contacts of the chassis or fixed connector include portions which fit into the reference board 14, and in the arrangement shown those connector portions extend through the reference board to the other side in the form of wrap post elements designated 22 and 24 in FIG. 1, in particular 22*a*–22*g* and 24*a*–24*g* corresponding to each of the chassis connectors 20*a*–20*g*. The posts or pins of one connector are connected electrically to the pins of another connector or to an appropriate system location. Alternatively, electrical connections could be made through board 14**.

Figure 2:
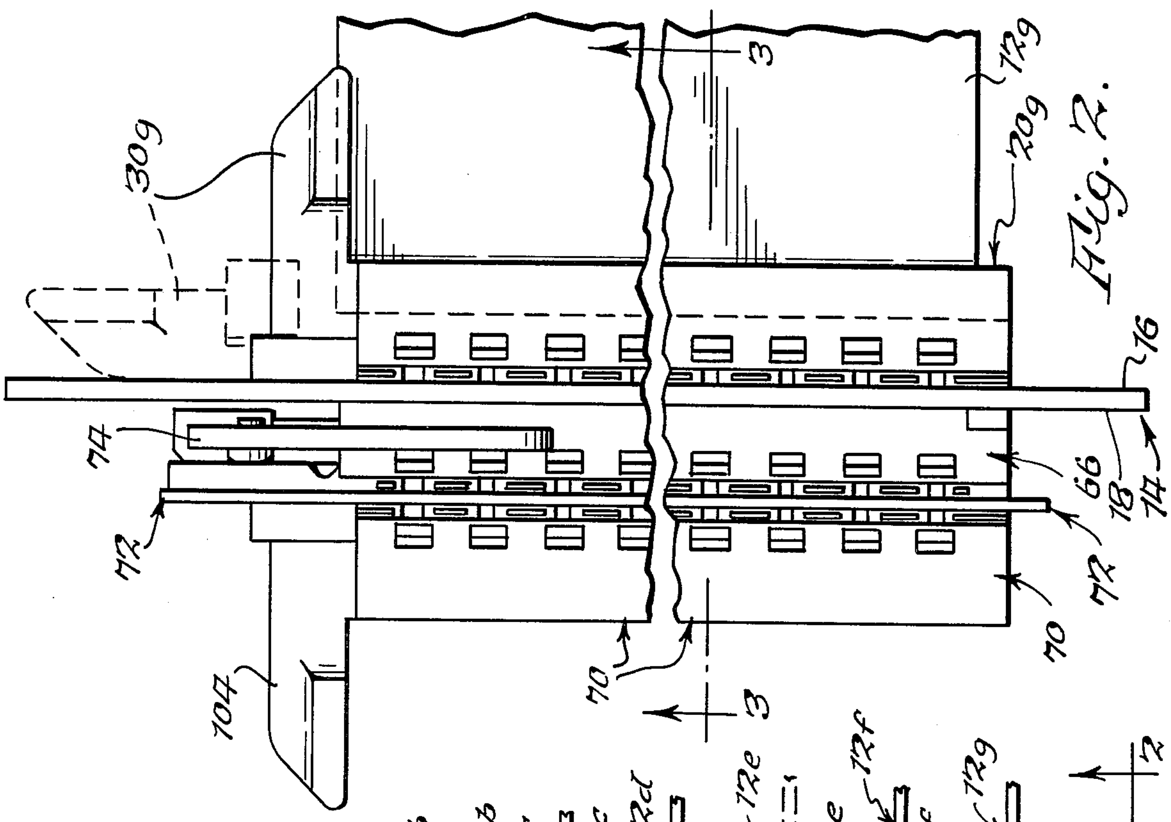
FIG. 2 is a view taken about on lines 2—2 in FIG. 1 in the direction of the arrows.

By way of example, the electrical connectors 20 can be those commercially available from AMP incorporated known as zero insertion force printed circuit connectors and shown in AMP data sheet number 76-376 dated October 1976. The body of each connector is of synthetic plastic material, for example glass-filled nylon, and the electrical contact elements within the connector body can be of copper. Each connector 20 includes a lever or handle 30 which is pivotally connected to the housing 20 and mechanically connected to camming elements (not shown) within body 20 so that during movement between two positions the lever 30 moves components of the body between a position releasing the circuit card element and a position clamping or firmly gripping the element. As shown in FIG. 2, lever **30*g* is set in a position causing connector body 20*g* to clamp or hold the circuit card 12*g*, and is movable to the position shown in broken lines wherein it allows the circuit board 12*g* to be removed from the body 20*g*. In the assembly shown, levers 30*a*–30*g* are associated with connectors 20*a*–20*g*** respectively.

Figures 3, 4:
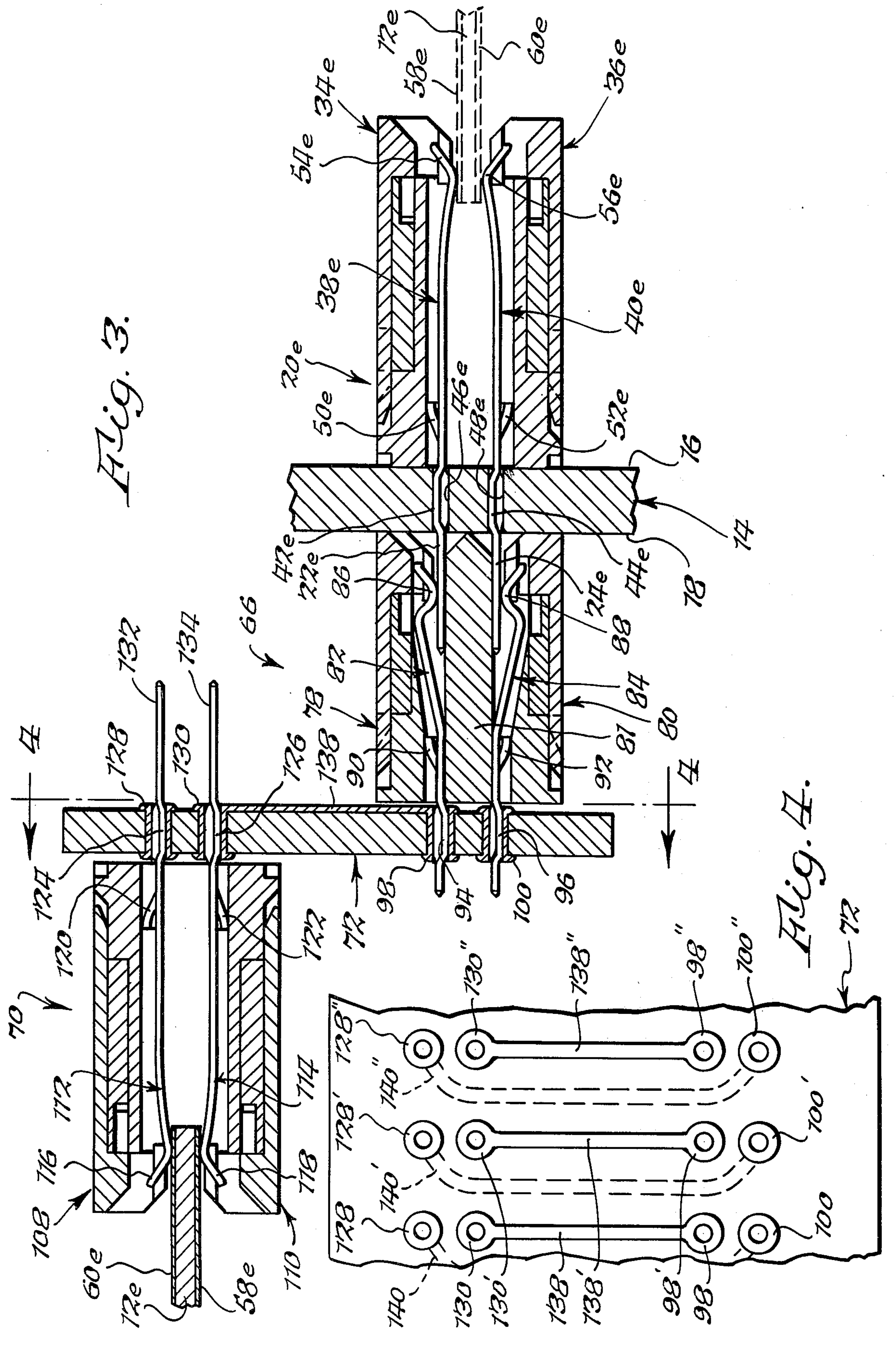
FIG. 3 is a sectional view taken about on lines 3—3 in FIG. 2.
FIG. 4 is a fragmentary elevational view taken about on line 4—4 in FIG. 3.

As shown in more detail in FIG. 3, each connector body such as that of connector **20*e* includes a pair of opposed sidewall portions generally designated 34*e*–36*e*. The sidewall portions 34*e*, 36*e* are moved toward and away from each other in response to movement of lever or handle 30*e* between the two positions shown in FIG. 2. The connector 20*e* includes a pair of electrical contact strip elements 38*e*,40*e* of copper or similar electrical conducting material which can be gold-plated at appropriate contact areas or portions thereon. The contact strip elements 38*e*,40*e* include sections at one end defining the wrap posts 22*e*,24*e* shown in FIG. 1. The contact strips 38*e* and 40*e* include intermediate portions 42*e* and 44*e* shown in FIG. 3 which contact or engage the inner surfaces of apertures 46*e* and 48*e* respectively, for making mechanical connection between the particular connector 20 and the reference board 14. The portions 42*e* and 44*e* are offset from the adjacent body portions of the strips 38*e* and 40*e* as shown in FIG. 3 in a manner facilitating a firm but releaseable contact between the inner surfaces of the apertures and the strip sections 42*e*,44*e*** and adjacent strip body portions.

The electrical contact strip elements **38*e* and 40*e* are formed to include intermediate leg or foot portions 50*e* and 52*e* respectively extending outwardly so as to engage or contact the inner wall surface of the corresponding side portion 34*e* and 36*e*, respectively. The foot portions 50*e*,52*e* serve to support and position the contact strip elements 38*e*,40*e*. The opposite ends of the strip elements are formed to include contact portions 54*e*,56*e* adjacent the open end of the connector body 20*e* for making electrical contact with the circuit card 12*e*. In particular, when the circuit card 12*e* is inserted into the open end of the connector body, the contact portions 54*e* and 56*e* engage or contact electrically conductive regions 58*e* and 60*e* on opposite surfaces of the circuit card 12. The resiliency or spring of the contact strip elements 38*e* and 40*e*, the urging force of the foot members 50*e* and 52*e* and the force provided by the side wall portions 34*e*,36*e* being urged together by the lever and cam action all provide an effective electrical contact between the portions 54 and 56 and the regions 58 and 60, respectively. The foregoing also provides sufficient mechanical gripping force to hold the circuit card 12***e* in place. In addition, the lever 30*e* includes a groove or recess along the one surface to receive the edge of the circuit card as shown in FIG. 2 thereby also supporting the card.

In a typical assembly both the received edge of the circuit card 12*e* and the connector body 20*e* and are of considerable length in a direction perpendicular to the plane of the paper as viewed in FIG. 3. The circuit card 12*e* includes a plurality of discrete contact regions 58*e* and 60*e* at spaced locations along the edge thereof. Similarly, the connector body 20*e* is provided with a corresponding plurality of contact strip elements 38*e* and 40*e* at spaced locations along the length thereof. In other words, when a circuit card 12*e* is inserted in the chassis connector 20*e*, the large number of discrete contact regions 58*e* and 60*e* along the edge thereof mate with a corresponding plurality of electrical contact strip elements 38*e* and 40*e*. These, in turn, have portions 42*e* and 44*e*, respectively, which fit into a corresponding plurality of apertures in the reference board 14 which portions terminate in wrap posts 22*e* and 24*e*, respectively, for providing electrical connection to the remainder of the system circuit. Also, the foregoing description applies to each circuit card 12*a*–12*g* and corresponding connector elements 20*a*–20*g*, it being understood that a plurality of circuit cards and chassis connector elements typically are connected to one side of the reference board 14 thereby providing a stacked arrangement of circuit cards and connectors in a relatively congested, closely-spaced arrangement. The circuit cards and connectors are positioned closely adjacent to enable a large number thereof to be included in a given chassis area which makes difficult and in most instances impossible any access to a particular circuit card and components thereon while the card is connected in the stacked assembly. This is especially so due to the fact that the circuit cards usually are of considerable length in a direction perpendicular to the plane of the reference board 14.

In accordance with the present invention, there is provided an adapter for transferring the electrical connections of a circuit card of an electrical system from a chassis or stationary connector in a congested chassis area or region on one side of the reference board to a convenient access area on the opposite side of the reference board. The adapter comprises a first electrical connector element generally designated 66 for making electrical connection to the system at a location on the opposite side of the reference board 14 in correspondence with a particular chassis connector 20. The adapter further comprises a second electrical connector element generally designated 70 for making electrical connection to the circuit card 12, and means in the form of a circuit board element 72 for joining the first and second electrical connector elements mechanically and electrically adjacent the opposite side 18 of the reference board 14. As a result, a selected circuit card element 12 can be disconnected from the corresponding chassis connector 20 and moved to the uncongested area or region adjacent the opposite side of the reference board 14 and connected to the second electrical connector element 70 of the adapter to facilitate working on the circuit card in a manner which does not increase significantly the electrical path length from the reference board 14 to the circuit card 12.

Electrical connector 66 includes an elongated rectangular shaped body having one side portion adapted to receive the wrap post elements 22,24 extending through the reference board 14 from the corresponding chassis connector 20. By way of example, in the arrangement illustrated in FIG. 1 connector 66 receives the wrap post elements 22*e*,24*e* extending through reference board 14 from chassis connector 20*e*. The connector element 66 includes a handle or lever 74 as shown in FIG. 2 which cooperates with camming elements in the connector body whereby components thereof are moved between two positions to release and hold the wrap post elements. The body of connector 66 as shown in FIG. 3 includes a pair of sidewall portions 78,80 and the connector also includes an intermediate wall portion 81 disposed between side wall portions 78,80 thereby defining two spaced regions there between. The sidewall portions 78,80 are moved toward and away from the intermediate wall 81 in response to the movement of handle 74 in a manner similar to chassis connector 20. The connector 66 further includes a pair of electrical contact strip elements 82 and 84 of suitable electrical conducting materials such as copper and gold-plated at appropriate locations similar to strips 38,40 of the chassis connector 20. The contact strip elements 82,84 are located in the regions or chambers defined between the intermediate wall 81 and the corresponding side wall portion 78 and 80. The contact strip elements 82 and 84 include sections 86 and 88, respectively, located in the region near the end of the body of connector 66 which receives the wrap post elements. In particular, the contact surface portions 86 and 88 are adapted to engage or contact corresponding wrap post 22 and 24, respectively, which extend into the connector body into the regions between side walls 78,80 and intermediate wall 81. The contact strip elements 82 and 84 are provided with leg or foot-like portions 90 and 92, respectively adjacent the opposite side of the connector body which engage inner surfaces of the corresponding side wall portions 78 and 80 for maintaining position of the contact strip elements. The contact strip elements 82 and 84 extend outwardly from the body of connector 66 and are formed to include contact portions 94 and 96 adapted to fit in and make electrical contact with the inner surfaces of apertures provided with layers or coatings of electrically conductive material 98 and 100, respectively, such as metal. The portions 94 and 96 are offset from the adjacent body portions of the strips 82 and 84, respectively, as shown in FIG. 3 in a manner facilitating a firm but releasable contact between the inner surfaces of the apertures and the strip sections 94,96 and adjacent strip body portions. The length of each contact strip element 82, 84 between the corresponding foot 90,92 and contact section 86,88 is disposed angularly outwardly relative to intermediate wall 81 to enhance the gripping or contacting spring force between sections 86,88 and the corresponding wrap post elements. Such force is provided by the resiliency or spring of the contact strip elements 82,84, the urging force of the foot members 90,92 and the force provided by the side wall portions 78,80 being urged together by the lever and cam action.

Electrical connector 70 is substantially similar to one of the chassis connectors 20 and includes a lever 104 shown in FIG. 1 which is pivotally connected to the connector housing and mechanically connected to camming elements (not shown) within the connector housing so that during movement between two positions the lever 104 moves components of the connector housing or body between a position clamping or firmly gripping a circuit card and a position releasing the card. As shown in FIG. 1, lever 104 is shown in a position causing the body of connector 70 to clamp or hold the circuit card 12*e* which has been removed from the opposite side of reference board 14. As shown in more detail in FIG. 3, the body of connector 70 includes a pair of opposed sidewall portions 108,110 moveable toward and away from each other in response to operation of lever 104 in a manner similar to that of chassis connector 20. A pair of contact strip elements 112 and 114 are included in connector 70 similar to contact strip elements 38 and 40, respectively of the chassis connectors. The contact strip elements 112 and 114 have end contact portions 116 and 118, respectively, feet or leg portions 120 and 122, respectively, and offset contact portions 124 and 126 respectively. The contact portions 124 and 126 are received in apertures in circuit board 72 provided with coatings or regions 128 and 130 of electrical conducting material such as metal. The portions 124 and 126 are offset from adjacent body portions of the strips 112 and 114, respectively, as shown in FIG. 3 in a manner facilitating a firm but releasable contact between the inner surfaces of the apertures and the strip sections 124,126 and adjacent strip body portions. The contact strip elements 124 and 126 terminate in end portions 132 and 134, respectively, which extend beyond board 72.

The metal-plated conductive apertures 98 and 130 of the circuit board 72 are connected electrically by a band or strip 138 of electrically conducting material, such as metal deposited or plated on the surface of board 72. Board 72 includes a series of related apertures 98,130 arranged in a direction perpendicular to the plane of the paper as viewed in FIG. 3. This is shown in further detail in FIG. 4 which illustrates three sets of apertures 98,130, 98′,130′ and 98″,130″ and connecting paths 138,138′, 138″. A typical adapter would include a large number of such sets. Likewise, the metal plated conductive apertures 100 and 128 are connected electrically by bands or strips 140 of electrically conducting material such as metal applied to the surface of board 72, in the device shown on the opposite surface of board 72. Alternatively, these strips could be on the same surface of board 72. As shown in FIG. 4 the sets of apertures 100,128 100′,128′ and 100″,128″ are connected electrically by paths 140,140′ and 140″, and a typical adapter would include a large number of such sets. In the foregoing arrangement, circuit board 72 would be of insulative material.

By way of example, in an illustrative adapter device, circuit card 72 has a minimum width of about 1.1 inch, the distance between the centers of plated apertures 100 and 128 measured perpendicular to the longitudinal axis of card 72 is about 0.6 inch, the distance between the center of apertures 98,100 is about 0.1 inch and the same distance exists between apertures 128, 130.

The circuit card adapter of the present invention operates in the following manner when it is desired to perform work on one of the circuit cards in the closely-stacked arrangement,for example making tests on or repairs to circuit components or portions of an individual card. The circuit card of interest is selected, and the location on the opposite side of the chassis or reference board 14 in correspondence with this particular circuit card and its chassis connector is identified. In particular, with respect to the example illustrated in FIG. 1 where the circuit card 12*e* is the one of interest, the circuit card adapter comprising connectors 66 and 70 joined by element 72 is connected to chassis board 14 at a location on the opposite side 18 thereof in correspondence with the chassis connector 20*e*. This is accomplished by manipulating lever 74 of connector 66 to move the side walls to an open position and then placing the adapter so that the wraps post elements 22*e*, 24*e* extending out from side 18 of reference board 14 are received in connector 66. Then lever 74 is manipulated to close the side walls of connector 66 so that it clamps or grasps wrap posts 22*e*, 24*e* in a manner making mechanical and electrical connection thereto. In a typical assembly, there are a large number of wrap post elements corresponding to a single chassis connector, the sets of wrap post elements being arranged in spaced relation in a direction perpendicular to the plane of the paper as viewed in FIG. 1, for example a range of from about 15 to about 175 sets, each of which is mechanically and electrically connected to components within connector 66 of the adapter. Then lever 30*e* of chassis connector 20*e* is manipulated to release circuit card 12*e* which is removed form the congested area of the closely stacked circuit cards 12*s*–12*g* on the outside of the reference board 14 and then transferred to the uncongested, open area adjacent the opposite side 18 of board 14. Lever 104 is manipulated to move the side walls of connector 70 to an open position, and the edge of circuit card 12*e* bearing the contact portions is inserted into the open side of connector 70. The sense or orientation of circuit card 12*e* when received in connector 70 is displaced 180° about an axis perpendicular to the plane of card 12*e* relative to the original sense or orientation when received in connector 20. Lever 104 then is manipulated to a position wherein the side walls of connector 70 close on the edge of card 12*e* so that connector 70 makes electrical connection to the contact portions on the edge of the circuit card, as well as making mechanical connection to the card along the edge thereof.

When a circuit card is connected to the adapter of the present invention which, in turn, is connected to reference board 14, the following electrical paths are defined. The contact portions 86 and 88 of the contact strip elements 82 and 84, respectively, of connector 66 make electrical connection to the wrap post elements or terminals 22 and 24, respectively, which are connected electrically to post elements of other connectors or to appropriate system locations as previously described. The contact portions 116 and 118 of contact strip elements 112 and 114, respectively, of connector 70 make electrical connection to the circuit card, in partiuclar to the conductive sections 60 and 58 along the edge thereof. An electrical path is defined between contact portion 86 of connector 66 and contact portion 118 of connector 70 as follows: from contact portion 86 through contact strip element 82, through conductive plated aperture 98 on board 72, through conductive path 138, through conductive plated aperture 130, through contact strip element 114 of connector 70 to contact portion 118. An electrical path is defined between contact portion 88 of connector 66 and contact portion 116 of connector 70 as follows: from contact portion 88 through contact strip element 84, through conductive path 140, through conductive plated aperture lining 128, through contact strip element 112 of connector 70 to contact portion 116. Each of the foregoing sets of paths is provided by the connectors 66 and 70 and circuit card 72 of the adapter for each of the large number of positions described above corresponding to the sets of wrap post elements, for example in a typical range of 15–75 positions.

Each of the two electrical paths described above, the two paths defining one set, has substantially the same length. The length of each path, in turn, is significantly less than the distance measured along the circuit card 12 in an outward direction from the plane of reference board 14 as viewed in FIGS. 1 or 3 when the circuit card 12 is connected to its chassis connector 20. Thus the length of the electrical signal path between circuit card 12 and reference board 14 through the adapter of the present invention is considerably less than the electrical signal path through extender cards heretofore available. In particular, the length of the electrical signal path through the adapter of the present invention includes the width of connector element 66, the width of connector element 70 and the distance along the paths 130, 140 on board 72. The width of connector 70 and of connector 66 is measured parallel to the plane of the paper as viewed in FIG. 3. In the apparatus shown, this electrical path length is substantially no greater than about three times the length of the electrical path through the corresponding chassis connector 20 between reference board 14 and the circuit card 12 when it is connected to the chassis connector.

With the circuit card 12*e* mechanically held by the adapter adjacent side 18 of reference board 14 and extending outwardly from the plane of reference board 14,18 and with circuit card 12*e* electrically connected to the wrap posts of its connector 20 by the adapter, the electrical connections of circuit card 12*e* of the electrical system have been transferred by the adapter from the chassis connector 20 in a congested area on side 16 of reference board 14 to a convenient access area on the opposite side 18 of the reference board. By virtue of the electrical connections provided by connectors 66,70 of the adapter and the sense of the electrical paths 138,140 on circuit card 72, the circuit 12 behaves or functions electrically in the system in the same manner as it did when connected to its chassis connector. As shown in FIG. 1, completely unobstructed and free access is provided to both surfaces and to three edges of the circuit card 12*e*. This is accomplished in a manner which does not increase significantly the electrical path length from the chassis board 14 to the circuit card 12*e*. In addition, the card test adapter which includes the two connectors 66 and 70 joined mechanically and electrically by circuit board 72 is simple in construction, effective in operation and convenient to use. The nature of the connectors provides easy connection and disconnection of the circuit card and also the card test adapter as well.

When the operations such as testing and repair have been completed on circuit card 12*e*, lever 104 is moved to a position releasing the circuit card from connector 70 whereupon the card is returned and reconnected to its chassis connector 20*e*. The adapter can be removed from reference board 14 for re-connection to another location on side 18 of the board in correspondence with the chassis connector of another circuit card on which it is desired to perform trouble shooting or other work in the uncongested area adjacent side 18 of the reference board.

It is therefore apparent that the present invention accomplishes its intended objects. While a single embodiment of the present invention has been described in detail, this is for the purpose of illustration, not limitation.

We claim:

1. An adapter for transferring the electrical connections of a circuit card of an electrical system from a stationary connector in a congested area on one side of a reference board to a convenient access area on the opposite side of the board, said electrical connections of said circuit card comprising a plurality of discrete electrical contact regions and said stationary connector including a plurality of contacts having a positional relationship with said contact regions for mating with said contact regions to connect said card to said system in a predetermined manner and said reference board having means on both sides for making electrical connection to said system, said adapter comprising:

(a) first means for making electrical connections to said system at a location on the opposite side of said reference board in correspondence with said contacts of said stationary connector;

(b) second means for making electrical connections to said circuit card in correspondence with said electrical contact regions of said circuit card; and (c) means defining an electrical path between said first and second means, said path having a length significantly less than the distance measured along said circuit card in a direction outwardly of the plane of said reference board when said circuit card is connected to said stationary connector, said path defining means being arranged to convey signals between said first and second means of said adapter in a manner interchanging the connections between said first and second means relative to the positional relationship between said electrical contact regions of said circuit card and said contacts of said stationary connector on the other side of said reference board so that said circuit card is connected electrically to said system on the other side of said reference board in the same manner as it was by said stationary connector on the one side of said reference board;

(d) whereby said circuit card can be disconnected from said stationary connector and moved to said opposite side of said reference board and connected to said second means of said adapter to facilitate working on said circuit card in a manner which does not increase significantly the electrical path length from said reference board to said circuit card and in a manner such that said circuit card functions electrically in the system in the same manner as it did when connected to said stationary connector.

2. Apparatus according to claim 1, wherein said electrical path has a length no greater than about three times the length of the electrical path through said stationary connector between said reference board and said circuit card when circuit card is connected to said stationary connector.

3. Apparatus according to claim 1, wherein said circuit card has oppositely-directed surfaces meeting at an edge and said discrete electrical contact regions are on said oppositely-directed surfaces.

4. Apparatus according to claim 3, further including a plurality of sets of said contact regions in spaced relation along said edge, said path defining means including a corresponding plurality of portions associated with said sets of contact regions on said circuit card.

5. An adapter for transferring the electrical connections of a circuit card of an electrical system from a stationary connector in a congested area on one side of a reference board to a convenient access area on the opposite side of the board, said electrical connections of said circuit card comprising a plurality of discrete electrical contact regions and said stationary connector including a plurality of contacts having a positional relationship with said contact regions for mating with said contact regions to connect said card to said system in a predetermined manner and said reference board having means on both sides for making electrical connection to said system, said adapter comprising:

(a) a first electrical connector element for making electrical connections to said system at a location on the opposite side of said board in correspondence with said contacts of said stationary connector;

(b) a second electrical connector element for making electrical connections to said circuit card in correspondence with said electrical contact regions of said circuit card; and (c) means for joining said first and second electrical connector elements mechanically and electrically adjacent said opposite side of said reference board, said joining means including means for defining an electrical path between said first and second connector elements for conveying signals between said first and second connector elements in a manner interchanging the connections between said first and second electrical connector elements relative to the positional relationship between said electrical contact regions of said circuit card and said contacts of said stationary connector on the other side of said reference board so that said circuit card is connected electrically to the system on the other side of said reference board in the same manner as it was by said stationary connector on the one side of said reference board;

(d) whereby said circuit card can be disconnected from said stationary connector and moved to said opposite side of said reference board and connected to said second electrical connector element of said adapter to facilitate working on said circuit card in a manner which does not increase significantly the electrical path length from said reference board to said circuit card and in a manner such that said circuit card functions electrically in the system in the same manner as it did when connected to said stationary connector.

6. Apparatus according to claim 3, wherein the electrical path between said circuit card and said reference board when said circuit card is connected to said second electrical connector element has a length significantly less than the distance measured along said circuit card in a direction outwardly of the plane of said reference board when said circuit card is connected to said stationary connector.

7. Apparatus according to claim 3, wherein the electrical path between said circuit card and said reference board when said circuit card is connected to said second electrical connector element has a length no greater than about three times the length of the electrical path through said stationary connector between said reference board and said circuit card when said circuit card is connected to said stationary connector.

8. Apparatus according to claim 3, wherein said circuit card has oppositely-directed surfaces meeting at an edge, said discrete electrical contact regions are on said oppositely-directed surfaces, and a plurality of sets of said contact regions are in spaced relation along said edge.

9. Apparatus according to claim 6, wherein said stationary connector is elongated in shape and includes means along one side thereof for receiving said edge of said circuit card and making electrical connection to said contact portions and electrical terminal means extending from another side of said stationary connector and adapted to extend through said board to said opposite side thereof for making electrical connection to said system and to said first electrical connector of said adapter.

10. Apparatus according to claim 7, wherein said first electrical connector element of said adapter is elongated in shape and includes means along one side thereof for making electrical connection to said terminal means of said stationary connector extending through said reference board and means operatively associated with another side of said first connector element for making mechanical and electrical connection to said joining means.

11. Apparatus according to claim 8, wherein said joining means comprises an elongated rigid body having means on one surface thereof for operatively engaging said mechanical and electrical connection means of said first connector element and having means on another surface thereof for making mechanical and electrical connection to said second electrical connector element of said adapter.

12. Apparatus according to claim 9, wherein said mechanical and electrical connection means of said first connector element comprises a plurality of members extending from said side of said connector and wherein said body of said joining means is substantially planar having opposite surfaces and said mechanical and electrical connection means of said joining means comprises apertures extending through said body of said joining means, said apertures being shaped, sized and positioned to receive said members from said first connector element.

13. Apparatus according to claim 6, wherein said second electrical connector element of said adapter is elongated in shape and includes means along one side thereof for receiving said edge of said circuit card and making electrical connection to said contact portions and means operatively associated with another side of said second connector element for making mechanical and electrical connection to said joining means.

14. Apparatus according to claim 11, wherein said joining means comprises an elongated rigid body having means on one surface thereof for operatively engaging said mechanical and electrical connection means of said second connector element and having means on another surface thereof for making mechanical and electrical connection to said first electrical connector element of said adapter.

15. Apparatus according to claim 12, wherein said mechanical and electrical connection means of said second electrical connector element comprises a plurality of members extending from said side of said connector and wherein said body of said joining means is substantially planar having opposite surfaces and said mechanical and electrical connection means of said joining means comprises apertures extending through said body of said joining means, said apertures being shaped, sized and positioned to receive said members from said second connector element.

16. Apparatus according to claim 6, wherein said path defining means includes a corresponding plurality of portions associated with said sets of contact regions on said circuit card.

17. Apparatus according to claim 3, wherein said joining means comprises an elongated element having means on one side for making connection to said first connector of said adapter, means on another side of said elongated element for making connection to said second connector, and said electrical path defining means on said elongated element is for electrically connecting said connection means of said joining means.

18. Apparatus according to claim 3, wherein said circuit card has generally coplanar opposite surface portions meeting at an edge and wherein each of said first and second electrical connector elements of said adapter is generally elongated in shape having a length substantially equal to the length of said circuit card measured along said edge and having a dimension measured perpendicular to said length and parallel to the plane of said circuit card significantly smaller than said length thereof.

19. An adapter for transferring the electrical connections of a circuit card of an electrical system from a stationary connector in a congested area on one side of a reference board to a convenient access area on the opposite side of the board, said circuit card having generally coplanar opposite surfaces meeting at an edge, said electrical connections of said circuit card comprising discrete electrical contact regions on said surfaces adjacent said edge, there being a plurality of said contact regions in spaced relation along said edge and said stationary connector including a plurality of contacts having a positional relationship with said contact regions of said card for mating with said contact regions to connect said card to said system in a predetermined manner and said reference board having means on both sides for making electrical connection to said system, the orientation of said circuit card being displaced 180° about an axis perpendicular to the plane of said circuit card when said card is moved from said one side of said board, to said opposite side of said board, said adapter comprising:

(a) a first electrical connector for making electrical connections to said system at a location on the opposite side of said board in correspondence with said contacts of said stationary connector, said first connector being generally elongated in shape having a length substantially equal to the length of said circuit card measured along said edge and having a dimension measured perpendicular to said length and parallel to the plane of said circuit card significantly smaller than said length thereof, said first connector including means along one side thereof for making electrical connection to terminal means of said stationary connector extending through said reference board and means operatively associated with another side of said first connector for making mechanical and electrical connection to another element, the longitudinal axis of said first connector being disposed generally parallel to the plane of said reference board when said first connector is in place;

(b) a second electrical connector for making electrical connections to said circuit card in correspondence with said electrical contact regions of said circuit card, said second connector being generally elongated in shape having a length substantially equal to the length of said circuit card measured along said edge and having a dimension measured perpendicular to said length and parallel to the plane of said circuit card significantly smaller than said length thereof, said second connector including means along one side thereof for receiving said edge of said circuit card and making electrical connection to said card and means operatively associated with another side of said second connector element for making mechanical and electrical connection to another element, the longitudinal axis of said second connector being disposed generally parallel to the plane of said reference board when said second connector is in place; and (c) means for joining said first and second electrical connectors mechanically and electrically adjacent said opposite side of said reference board, said joining means comprising an elongated planar element disposed in a plane generally parallel to the plane of said reference board when said joining means is in place and having means on one side for making connection to said mechanical and electrical connection means of said first connector of said adapter, means on another side of said elongated element for making connection to said mechanical and electrical connection means of said second connector, and electrical path defining means on said elongated element for electrically connecting said connection means of said joining means, said path defining means being arranged to convey signals between said first and second connectors of said adapter in a manner interchanging the connections between said first and second electrical connectors of said adapter relative to the positional relationship between said electrical contact regions of said circuit card and said contacts of said stationary connector on the other side of said reference board so that said circuit card is connected electrically to the system on the other side of said reference board in the same manner as it was by said stationary connector on the one side of said reference board;

(d) whereby said circuit card can be disconnected from said stationary connector and moved to said opposite side of said reference board and connected to said second electrical connector of said adapter to facilitate working on said circuit card in a manner which does not increase significantly the electrical path length from said reference board to said circuit card and in a manner such that said circuit card functions electrically in the system in the same manner as it did when connected to said stationary connector.

20. Apparatus according to claim 16, wherein said mechanical and electrical connection means of said first and second connectors each comprises a plurality of members extending from said side of said connector and wherein said mechanical and electrical connection means of said joining means comprises apertures extending through said element, said apertures being shaped, sized and positioned to receive corresponding ones of said members from said first and second connectors.

21. Apparatus according to claim 16, wherein said path defining means includes a corresponding plurality of portions associated with said sets of contact regions on said circuit card.

* * * * *

UNITED STATES PATENT AND TRADEMARK OFFICE

CERTIFICATE OF CORRECTION

PATENT NO. : 4,232,924

DATED : November 11, 1980

INVENTOR(S) : Mark H. Kline et al

It is certified that error appears in the above-identified patent and that said Letters Patent are hereby corrected as shown below:

Claim 6, line one, change "3" to --5--.

Claim 7, line one, change "3" to --5--.

Claim 8, line one, change "3" to --5--.

Claim 9, line one, change "6" to --8--.

Claim 10, line one, change "7" to --9--.

Claim 11, line one, change "8" to --10--.

Claim 12, line one, change "9" to --11--.

Claim 13, line one, change "6" to --8--.

Claim 14, line one, change "11" to --13--.

Claim 15, line one, change "12" to --14--.

Claim 16, line one, change "6" to --8--.

UNITED STATES PATENT AND TRADEMARK OFFICE

CERTIFICATE OF CORRECTION

PATENT NO. : 4,232,924

DATED : November 11, 1980

INVENTOR(S) : Mark H. Kline et al

It is certified that error appears in the above-identified patent and that said Letters Patent are hereby corrected as shown below:

Claim 17, line one, change "3" to --5--.

Claim 18, line one, change "3" to --5--.

Claim 20, line one, change "16" to --19--.

Claim 21, line one, change "16" to --19--.

Signed and Sealed this

*Eighth* Day of *September 1981*

[SEAL]

*Attest:*

GERALD J. MOSSINGHOFF

*Attesting Officer* *Commissioner of Patents and Trademarks*